United States Patent
Im et al.

(10) Patent No.: US 9,024,434 B2
(45) Date of Patent: May 5, 2015

(54) SEMICONDUCTOR PACKAGES

(75) Inventors: Yunhyeok Im, Hwaseong-si (KR); Kyol Park, Daejeon (KR); Taeje Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 417 days.

(21) Appl. No.: 13/461,949

(22) Filed: May 2, 2012

(65) Prior Publication Data
US 2012/0280382 A1  Nov. 8, 2012

(30) Foreign Application Priority Data
May 2, 2011 (KR) .......... 10-2011-0041682

(51) Int. Cl.
| | | |
|---|---|---|
| *H01L 23/34* | (2006.01) | |
| *H01L 23/12* | (2006.01) | |
| *H01L 23/373* | (2006.01) | |
| *H01L 23/36* | (2006.01) | |
| *H01L 23/31* | (2006.01) | |
| *H01L 23/427* | (2006.01) | |

(52) U.S. Cl.
CPC ............ *H01L 23/36* (2013.01); *H01L 23/3128* (2013.01); *H01L 23/427* (2013.01); *H01L 23/4275* (2013.01); *H01L 2224/16225* (2013.01); *H01L 2224/16227* (2013.01); *H01L 2224/32225* (2013.01); *H01L 2224/73204* (2013.01); *H01L 2924/15311* (2013.01)

(58) Field of Classification Search
CPC .... H01L 23/36; H01L 23/3128; H01L 23/427
USPC ..................... 257/712, 704, E23.11
See application file for complete search history.

(56) References Cited

U.S. PATENT DOCUMENTS

| | | | | |
|---|---|---|---|---|
| 5,007,478 | A | * | 4/1991 | Sengupta ......................... 165/10 |
| 5,819,402 | A | * | 10/1998 | Edwards et al. ................ 29/840 |
| 6,848,500 | B1 | * | 2/2005 | Langari et al. ........... 165/104.33 |
| 7,781,900 | B2 | * | 8/2010 | Carmona et al. .............. 257/789 |
| 2003/0202306 | A1 | * | 10/2003 | Dubhashi ..................... 361/93.8 |
| 2005/0007740 | A1 | * | 1/2005 | Neuschuetz et al. .......... 361/704 |
| 2005/0051300 | A1 | * | 3/2005 | Searls et al. ............. 165/104.21 |
| 2008/0023665 | A1 | * | 1/2008 | Weiser et al. ................... 252/71 |

FOREIGN PATENT DOCUMENTS

| | | |
|---|---|---|
| JP | 2005-510876 | 4/2005 |
| KR | 1020040058310 A | 7/2004 |
| KR | 1020050114033 A | 10/2008 |
| KR | 1020080114063 A | 12/2008 |

* cited by examiner

*Primary Examiner* — Luan C Thai
(74) *Attorney, Agent, or Firm* — Renaissance IP Law Group LLP

(57) ABSTRACT

Semiconductor package are provided. In one embodiment, the semiconductor package may include a substrate such as a circuit substrate, a semiconductor chip mounted on the circuit substrate, a molding (or an encapsulant) covering the semiconductor chip and the circuit substrate and including a first temperature control member, and a heat dissipation member covering the molding.

16 Claims, 18 Drawing Sheets

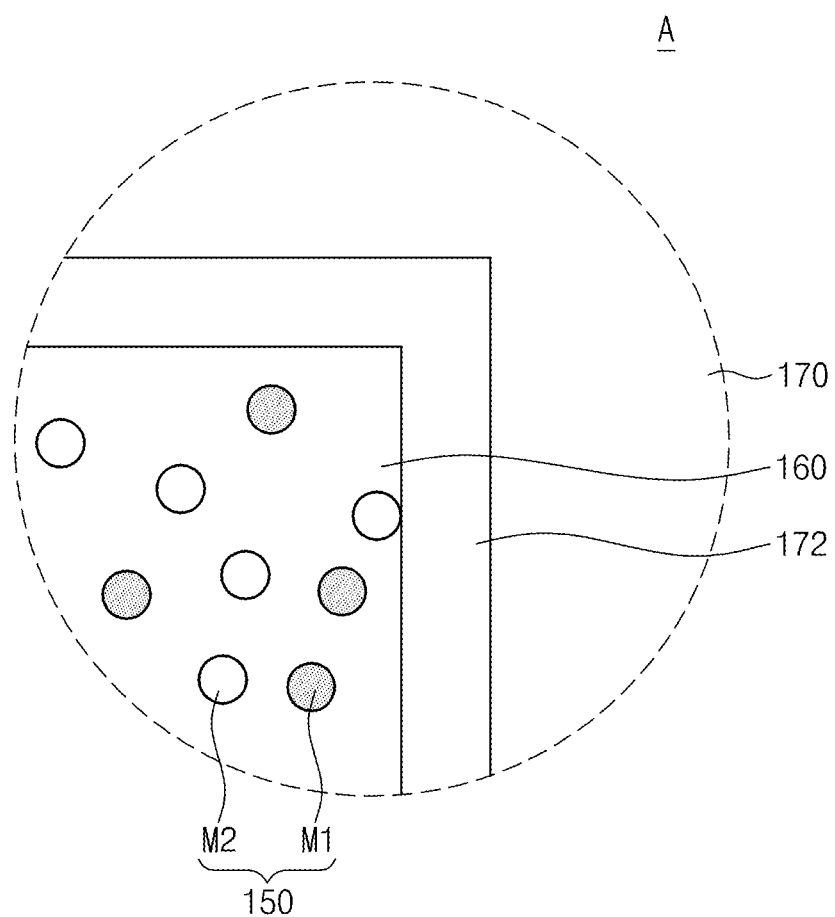

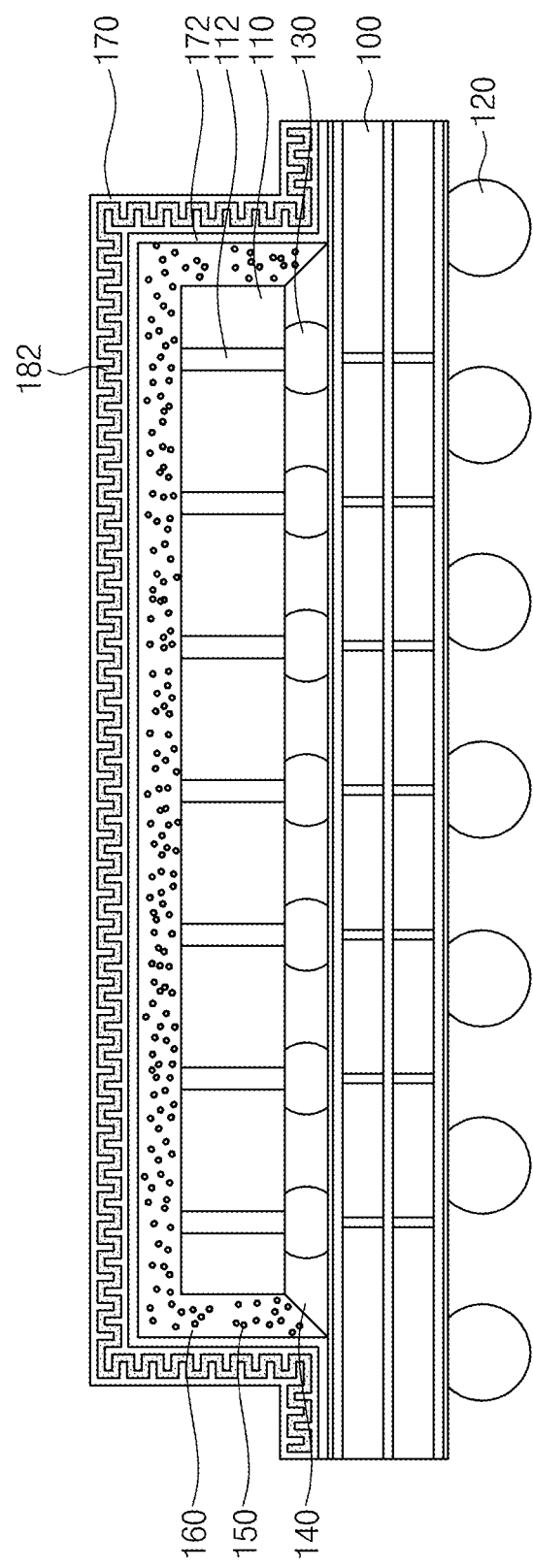

SEMICONDUCTOR PACKAGES

CROSS-REFERENCE TO RELATED APPLICATIONS

This U.S. non-provisional patent application claims priority under 35 U.S.C. §119 to Korean Patent Application No. 10-2011-0041682, filed on May 2, 2011, the entirety of which is incorporated by reference herein.

BACKGROUND

The present disclosure herein relates to semiconductor packages and, more particularly, to semiconductor package including through-electrode.

There is an increasing demand for thermal stability of a semiconductor package along with the miniaturization of the packages and their implementation in multi-function electronic products. For example, a cellular phone may perform various functions and generate heat as a by-product of performing those various functions. The heat generated may differ depending on the function being performed. The generated heat may not be sufficiently dissipated from the electronic products and, thus, the electronic products may suffer from various errors.

SUMMARY

Some embodiments may provide semiconductor package capable of improving heat dissipation efficiency.

In example embodiments, a magnetic memory device may include: a substrate; a semiconductor chip mounted on the substrate; a molding covering the semiconductor chip and the circuit substrate, and may include one or more first temperature control members; and a heat dissipation member covering the molding.

In some embodiments, the first temperature control member may include a phase change material.

In other embodiments, the first temperature control member may include a first material of which phase transition occurs at a first temperature, and a second material of which phase transition occurs at a second temperature different from the first temperature.

In still other embodiments, the molding may further include a plurality of thermally conductive particles being scattered in the first temperature control member.

In yet other embodiments, the first temperature control member may have a particle shape, and the first temperature control members may be scattered in the molding.

In yet still other embodiments, the molding may further include a plurality of porous material sections being separated from each other, and each of the porous material sections has a pore. The first temperature control members are disposed in the pores of the porous material sections.

In further embodiments, the molding may further include a porous material having pores, the first temperature control member may have a particle shape, and the first temperature control member may be disposed in one of the pores.

In still further embodiments, the first temperature control member may have a particle shape, and the first temperature control member may be surrounded by a capsule being made of a conductive material.

In even further embodiments, the molding may include a plurality of spaces being separated from each other, and each of the spaces may be filled with the first temperature control member.

In yet further embodiments, the molding may include a space having zigzag shape, and the space may be filled with the first temperature control member.

In yet further embodiments, the heat dissipation member may include metal, and the semiconductor package may further include an adhesive adhering the heat dissipation member to the molding and the circuit substrate.

In yet further embodiments, the semiconductor package may further include a second temperature control member disposed in the circuit substrate; a third temperature control member disposed in the semiconductor chip; and a fourth temperature control member disposed in the heat dissipation member.

In yet further embodiments, the semiconductor package may further include first solder balls electrically interconnecting the circuit substrate and the semiconductor chip; an under filler covering the first solder balls and filling a space between the circuit substrate and the semiconductor chip; second solder balls disposed on a bottom surface of the circuit substrate; a fifth temperature control member disposed in each of the first solder balls; a sixth temperature control member disposed in the under filler; and a seventh temperature control member disposed in each of the second solder balls.

In yet further embodiments, the fifth temperature control member may be agglomerated in a central region of each of the first solder balls, and each of the first solder balls may have a structure surrounding the fifth temperature control member. The seventh temperature control member may be agglomerated in a central region of each of the second solder balls, and each of the second solder balls may have a structure surrounding the seventh temperature control member.

In yet further embodiments, the semiconductor package may further include a heat sink disposed between the semiconductor chip and the molding, and including cooling fins. Gap regions between the cooling fins may be filled with the molding.

BRIEF DESCRIPTION OF THE DRAWINGS

The inventive concept will become more apparent in view of the attached drawings and accompanying detailed description.

FIG. 3B is an enlarged view illustrating a portion 'A' in FIG. 3A;

FIGS. 4A and 4B are cross sectional views illustrating semiconductor packages according to still other embodiments;

DETAILED DESCRIPTION OF THE EMBODIMENTS

Figure 1:
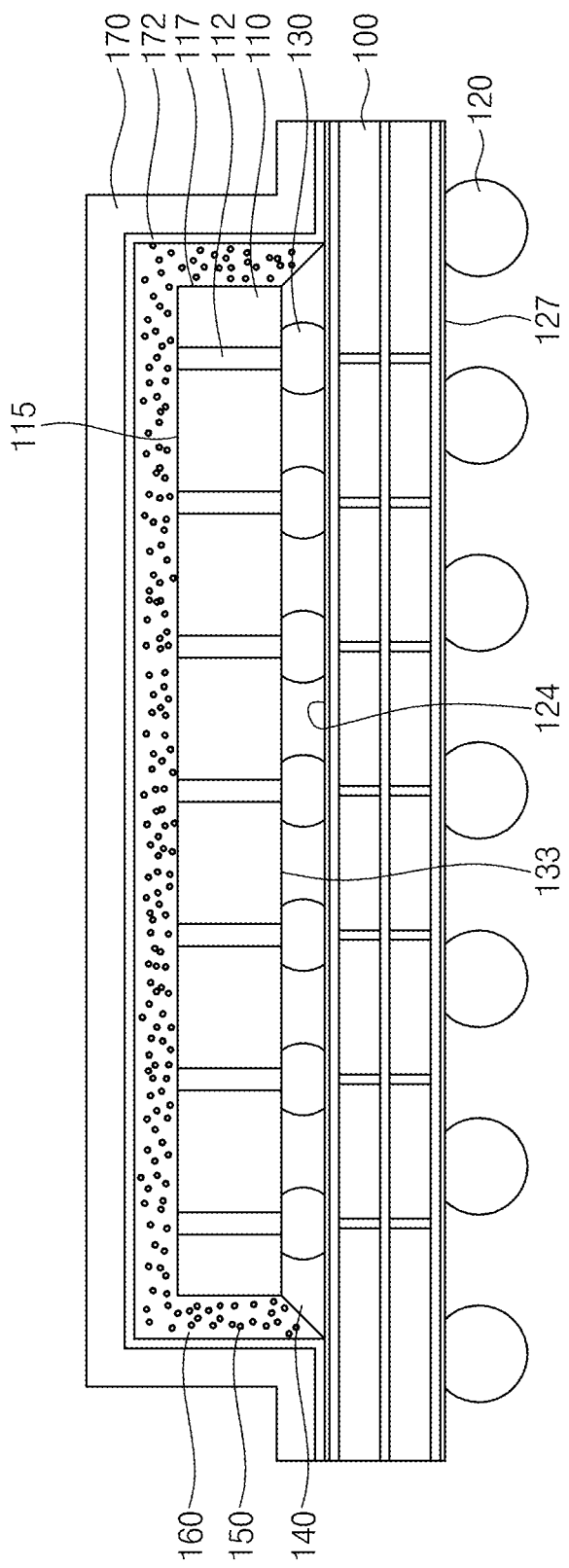
FIG. 1 is a cross sectional view illustrating a semiconductor package according to some embodiments.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 is a cross sectional view illustrating a semiconductor package according to some embodiments of the inventive concept.

Referring to FIG. 1, a semiconductor package according to some embodiments may include a substrate such as a circuit substrate 100, a semiconductor chip 110, first connection terminals such as first solder balls 120 and second connection terminals solder balls 130, an under filler 140, a molding 160 including a temperature control member 150, and a heat dissipation member 170.

The circuit substrate 100 may be a printed circuit board (PCB). The semiconductor chip 110 may be separated from a first surface 124 of the circuit substrate 100 and may face the first surface 124 of the circuit substrate 100. A plurality of the first solder balls 120 may be adhered to a second surface 127 of the circuit substrate opposite to the first surface 124.

The semiconductor chip 110 may have a certain surface 133 facing the circuit substrate 100.

The semiconductor chip 110 may be separated or spaced apart from the circuit substrate 100 by a distance substantially equal to a size of the second solder balls 130. Each of the second solder balls 130 may be in contact with the first surface 124 of the circuit substrate 100 and the certain surface 133 of the semiconductor chip 110. Each of the circuit substrate 100 and the semiconductor chip 110 may include contact pads (not shown). The second solder balls 130 may electrically connect the semiconductor chip 110 to the circuit substrate 100 through the contact pads. Each of the second solder balls 130 may be substantially smaller than the first solder balls 120.

The semiconductor chip 110 may include through-electrodes 112. The through-electrodes 112 may be electrically connected to the second solder balls 130. In an embodiment, there may be a plurality of semiconductor chips 110. The plurality of semiconductor chips 110 may be vertically stacked over the circuit substrate 100.

The under filler 140 may cover the second solder balls 130 and may fill a space between the circuit substrate 100 and the semiconductor chip 110. In an embodiment, a width of the under filler 140 may be greater than a width of the semiconductor chip 110. Thus, an edge of the under filler 140 may be disposed outside an edge of the semiconductor chip 110.

The molding 160 may cover the semiconductor chip 110 for protecting the semiconductor chip 110. In an embodiment, the molding 160 may cover a top surface 115 and a side surface 117 of the semiconductor chip 110 and the edge of the under filler 140, however, other implementations may not be limited thereto.

The molding 160 may be a mixture including epoxy resin, thermosetting resin, silicate, catalyst, and/or pigment.

The temperature control member 150 may include a phase change material. The phase change material may absorb or radiate heat by phase transition, for example, from solid to liquid, from liquid to solid, from liquid to gas, or from gas to liquid. That is, the temperature control member 150 may have characteristic absorbing or radiating heat, for example, using the characteristics of the phase change material. The phase change material may include a non-conductive material.

The temperature control member 150 may include at least one of paraffin ($C_{20}$~$C_{45}$), mineral, salt hydrate, carboxylic acid, sugar alcohol, di-n-alkylammonium salt having alkyl groups different from each other, or combinations thereof. For example, the temperature control member 150 may include at least one of n-paraffin, pentaerytritol, polyethylene, acetamide, prophylamide, naphthalene, stearic acid, poly glycolic acid E6000, wax, 3-heptadecanone, cyanamide, d-lactic acide, grlycerol, acetic acid, ethylene diamine, polyglycolic acid E400, poly ethylene glycol (PEG), $Na_2SO_4.10H_2O$, $Na_2HPO_4.12H_2O$, $Zn(NO_3)_2.6H_2O$, $Na_2S_3O_3.5H_2O$, $NaCH_3OCOO.3H_2O$, $MgCl_2.6H_2O$, $Al_2(SO_4)_3.10H_2O$, $NH_4Al(SO_4)_2.12H_2O$, $KAl(SO_4)_2.12H_2O$, $Mg(SO_3)_2.6H_2O$, $SrBr_2.6H_2O$, $Sr(OH)_2.8H_2O$, $Ba(OH)_2.8H_2O$, $Al(NO_3)_2.9H_2O$, $Fe(NO_3)_2.6H_2O$, $NaCH_2S_2O_2.5H_2O$, $Ni(NO_3)_2.6H_2O$, $Na_2S_2O_2.5H_2O$, $ZnSO_4.7H_2O$ or $CaBr_2.6H_2O$, dihexylammonium bromide, diocthlyammonium bromide, diocthlyammonium chloride, diocthlyammonium acetate, diocthlyammonium nitrate, diocthlyammonium formate, didecylammonium chloride, didecylammonium chlorate, didodecylammonium chlorate, didodecylammonium formate, didodecylammonium bromide, didodecylammonium nitrate, didodecylammonium acetate, didodecylammonium sulfate, didodecylammonium chloride, didodecylammonium 2-nitrobenzoate, didodecylammonium propionate.

The temperature control member 150 included in the molding 160 may have various shapes or structures as will be described below.

The heat dissipation member 170 may cover the molding 160. In an embodiment, a width of the circuit substrate 100 may be greater than a width of the semiconductor chip 110. Thus, the semiconductor chip 110 may not cover an edge of the first surface of the circuit substrate 100. The heat dissipation member 170 may cover the molding 160 and be extended onto the edge of the first surface of the circuit substrate 100. The heat dissipation member 170 may be adhered to the molding 160 and the circuit substrate 100 by an adhesive 172. The heat dissipation member 170 may include metal such as aluminum.

The various shapes of the temperature control member 150 in the molding 160 will be described hereinafter in more detail.

FIGS. 2A through 2G are cross sectional views illustrating structures of temperature control members according to some embodiments.

Figure 2A:
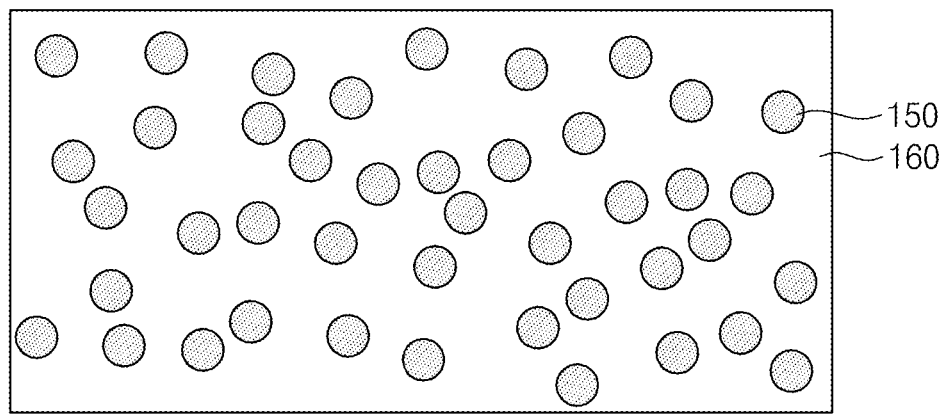
FIGS. 2A through 2G are cross sectional views illustrating structures of temperature control members according to some embodiments.

Referring to FIG. 2A, the temperature control member 150 may have a particle shape. There may be a plurality of temperature control members 150 provided within the molding 160. The temperature control members 150 of the particle shape may be scattered within the molding 160. In one embodiment, the temperature control members 150 may be scattered substantially throughout the molding 160. The molding 160 and the temperature control member 150 in FIG. 1 may correspond to the molding 160 and the temperature control members 150 in FIG. 2A. However, other implementations may not be limited thereto. The molding 160 and the temperature control member 150 in FIG. 1 may be replaced with various shapes which will be described hereinafter.

Figure 2B:
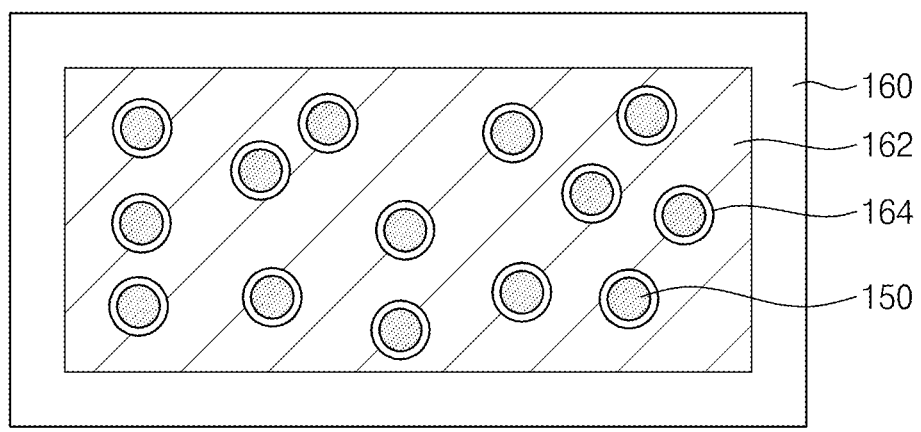

Referring to FIG. 2B, in an embodiment, the molding 160 may further include a porous material 162. The porous material 162 may include a plurality of pores 164. For example, the porous material 162 may be ziolite. One or more temperature control members 150 may have a particle shape and may be disposed in the pores 164 of the porous material 162.

Figure 2C:
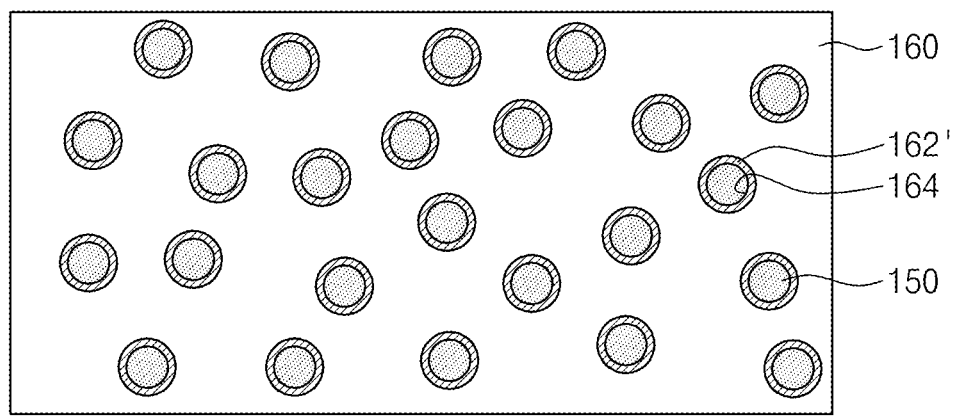

Referring to FIG. 2C, in an embodiment, a plurality of porous material sections 162' may be scattered within the molding 160. The porous material sections 162' may be separated from each other. The temperature control member 150 having the particle shape may be disposed in a pore 164 in each of the porous material sections 162'. For example, the porous material section 162' may have a shell shape surrounding the temperature control member 150. For example, the porous material section 162' may be ziolite.

Figure 2D:
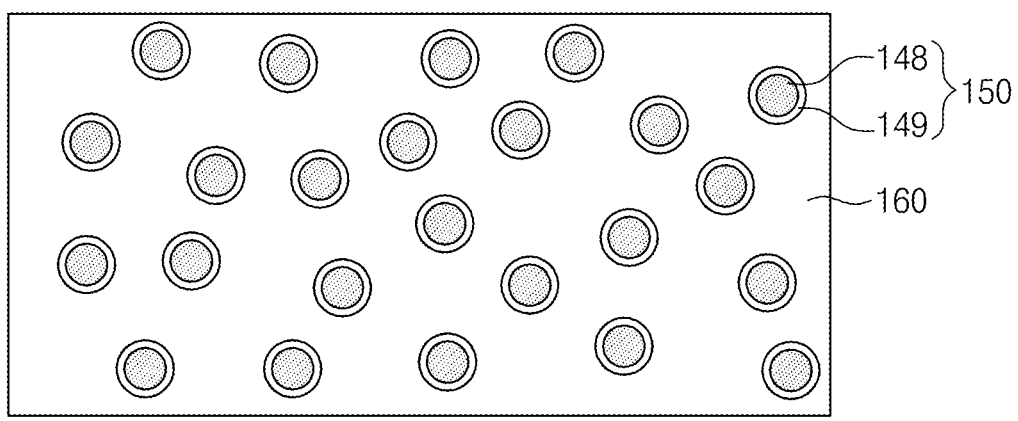

Referring to FIG. 2D, in an embodiment, the temperature control member 150 may include a phase change particle 148 and a capsule 149 surrounding the phase change particle 148. The phase change particle 148 may have a sphere or polyhedron structure. The capsule 149 may be made of a conductive material.

Figure 2E:
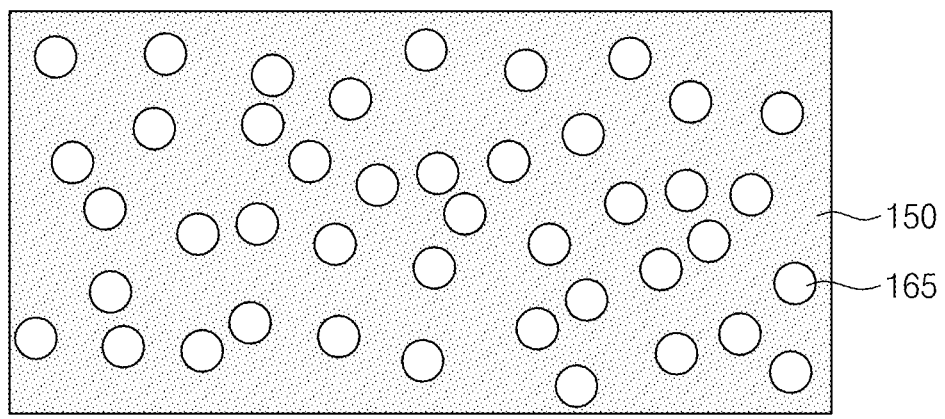

Referring to FIG. 2E, in an embodiment, the molding 160 may be the temperature control member 150. In the present embodiment, the temperature control member 150 as the molding 160 may cover the top surface and the side surface of the semiconductor chip 110 illustrated in FIG. 1 to protect the semiconductor chip 110. A plurality of thermally conductive particles 165 may be scattered in the temperature control member 150. For example, the thermally conductive particles 165 may be metal particles being made of aluminum, copper, silver and/or gold. Also, other metal particles or conductive particles may also be used within the spirit and scope of the present disclosure.

Figure 2F:
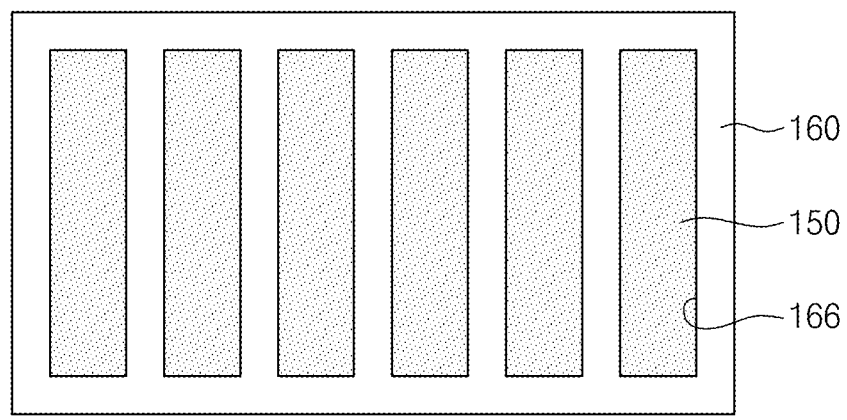

Referring to FIG. 2F, in an embodiment, the temperature control member 150 may fill each of a plurality of spaces 166 disposed in the molding 160. The plurality of spaces 166 may have a sphere or polyhedron shape. The plurality of spaces 166 may be separated from each other. Since the temperature control member 150 fills the space 166, the temperature control member 150 may have a shape corresponding to the shape of the space 166.

Figure 2G:
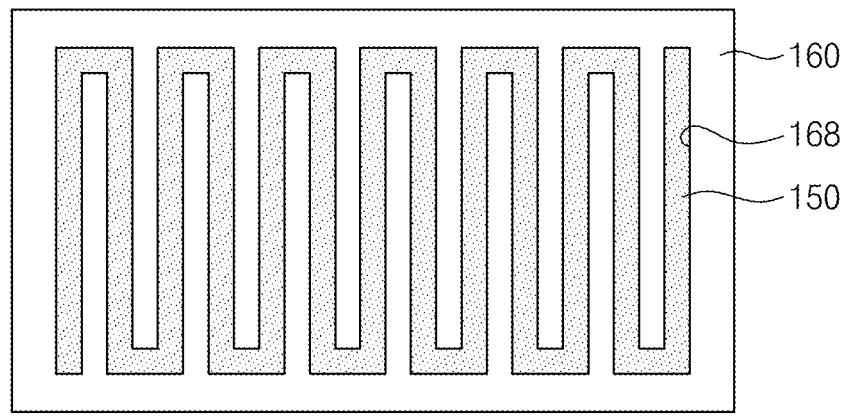

Referring to FIG. 2G, in an embodiment, the temperature control member 150 may fill a space 168 having a zigzag shape.

Since the molding 160 includes the temperature control member 150, the thermal stability of the semiconductor package may be improved by employing the temperature control member 150 and the heat dissipation member 170 (FIG. 1). Also, since the temperature control member 150 has various shapes, the temperature control member 150 may be suitably applied to semiconductor packages having various shapes.

Figure 3A:
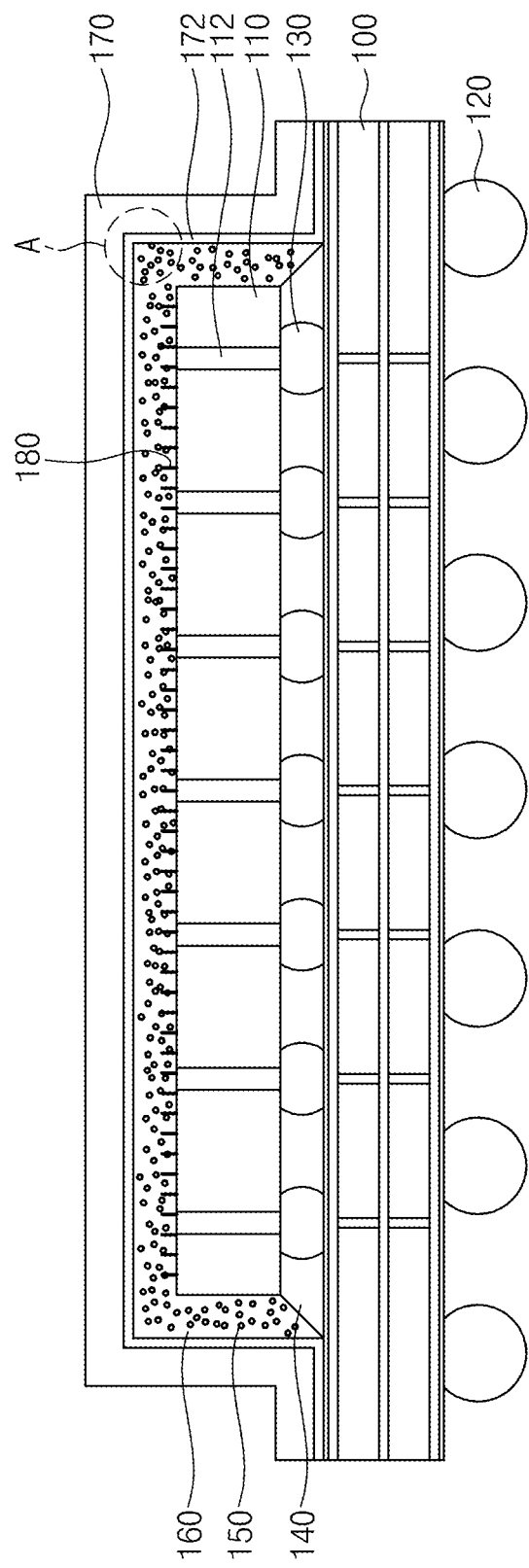
FIG. 3A is a cross sectional view illustrating a semiconductor package according to other embodiments.

Semiconductor packages according to the present embodiments in FIGS. 3A and 3B may be similar to the semiconductor package according to the first embodiments. For the sake of simplicity in explanation, the descriptions to the same characteristics and/or the same elements as in the first embodiments will be omitted or mentioned briefly. That is, differences between the present embodiments and the first embodiments will be mainly described hereinafter.

FIG. 3A is a cross sectional view illustrating a semiconductor package according to other embodiments, and FIG. 3B is an enlarged view illustrating a portion 'A' in FIG. 3A.

Referring to FIG. 3A, the semiconductor package may include a circuit substrate 100, a semiconductor chip 110, first solder balls 120 and second solder balls 130, an under filler 140, a molding 160 including a temperature control member 150, and a heat dissipation member 170. In some embodiments, the semiconductor package may further include a heat sink 180 between the semiconductor chip 110 and the molding 160. The heat sink 180 may be disposed within the molding 160. The heat sink 180 may include cooling fins having sizes ranging from nanometers to micrometers. Gap regions between the cooling fins may be filled with the molding 160. The heat sink 180 is illustrated in FIG. 3A, however, other implementations may not be limited thereto. The heat sink 180 may also be omitted.

Referring to FIG. 3B, the temperature control member 150 may include a first material M1 of which phase transition occurs at a first temperature, and a second material M2 of which phase transition occurs at a second temperature different from the first temperature. In an embodiment, the first material M1 may include a material of which phase transition occurs at about 89° C., and the second material M2 may include a material of which phase transition occurs at about 98° C. For example, the first material M1 may be the S89 manufactured by the Phase Change Material Products Limited (UK) company (PCM company), and the second material M2 may be the A95 manufactured by the PCM company. The S89 may include salt hydrate, and the A95 may include organic paraffin.

As described above, since the semiconductor package according to the present embodiments may be using the temperature control member 150 including the first and second materials M1 and M2 which have phase transition temperatures different from each other, the heat dissipation efficiency of the semiconductor package may be improved.

The temperature control member 150 in the present embodiments in FIGS. 3A and 3B may have shapes substantially the same as the shapes of the temperature control member 150 illustrated in FIG. 2A. However, other implementations may not be limited thereto. For example, the shape of the temperature control member 150 including the first and second materials M1 and M2 may be one of the shapes of the temperature control member s150 illustrated in FIGS. 2B to 2G.

Figure 4A:
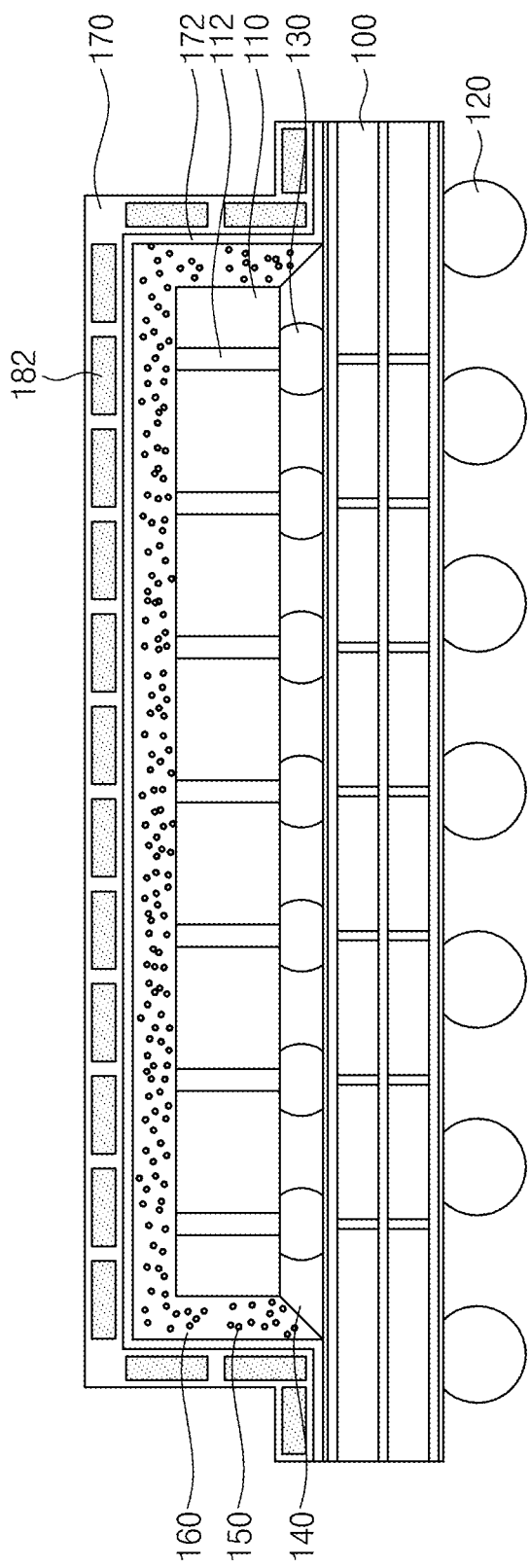

Semiconductor packages according to the present embodiments in FIGS. 4A and 4B may be similar to the semiconductor package in the first embodiments. For the sake of simplicity, the descriptions to the same characteristics and/or the same elements as in the first embodiments will be omitted or mentioned briefly. That is, differences between the present embodiments and the first embodiments will be mainly described hereinafter.

FIGS. 4A and 4B are cross sectional views illustrating semiconductor packages according to still other embodiments.

Referring to FIGS. 4A and 4B, the semiconductor package may include a circuit substrate 100, a semiconductor chip 110, first solder balls 120 and second solder balls 130, an under filler 140, a molding 160 including first temperature control member 150, and a heat dissipation member 170 including a second temperature control member 182. The second temperature control member 182 may include the phase change material described in the first embodiment. The first and second temperature control members 150 and 182 may include the same phase change materials to each other, or may respectively include phase change materials different from each other. In an embodiment, the second temperature control member 182 may include the first and second materials M1 and M2 described with reference to FIGS. 3A and 3B.

As illustrated in FIG. 4A, the second temperature control member 182 may have a shape similar to the shape of the temperature control member 150 described with reference to FIG. 2F. Alternatively, as illustrated in FIG. 4B, the second temperature control member 182 may have a shape similar to the shape of the temperature control member 150 described with reference to FIG. 2G. In other embodiments, the shape of the second temperature control member 182 may be one of the shapes of the temperature control members 150 illustrated in FIGS. 2A to 2E.

Figure 5A:
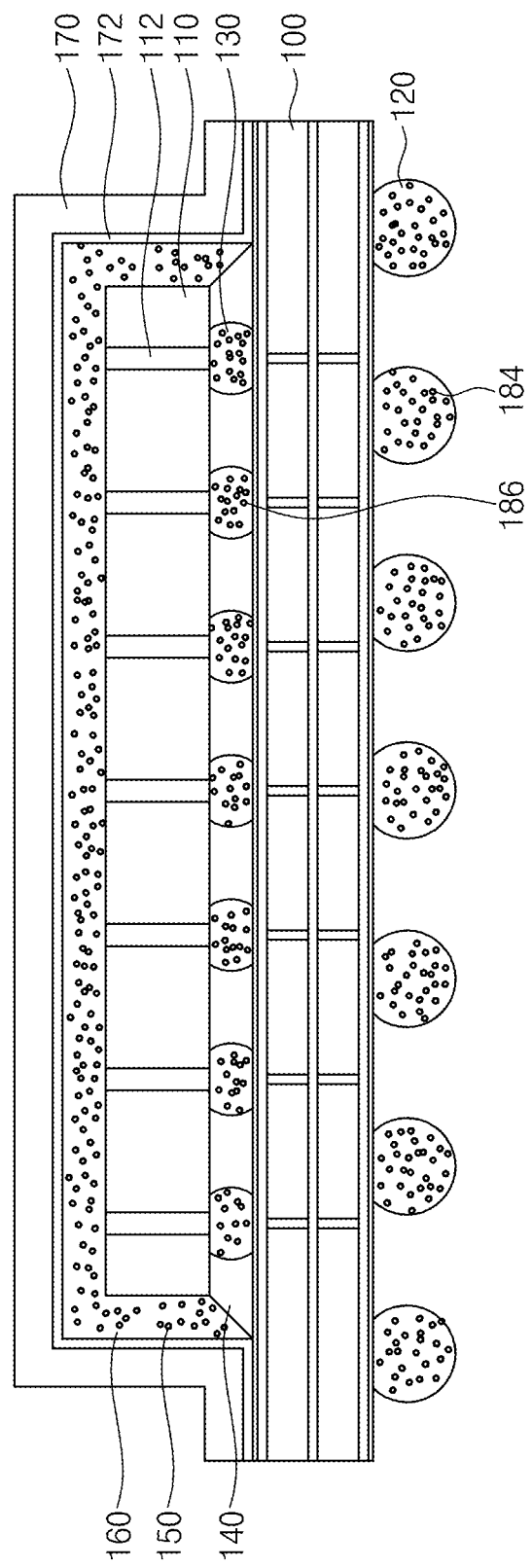
FIGS. 5A and 5B are cross sectional views illustrating semiconductor packages according to yet other embodiments.
Figure 5B:
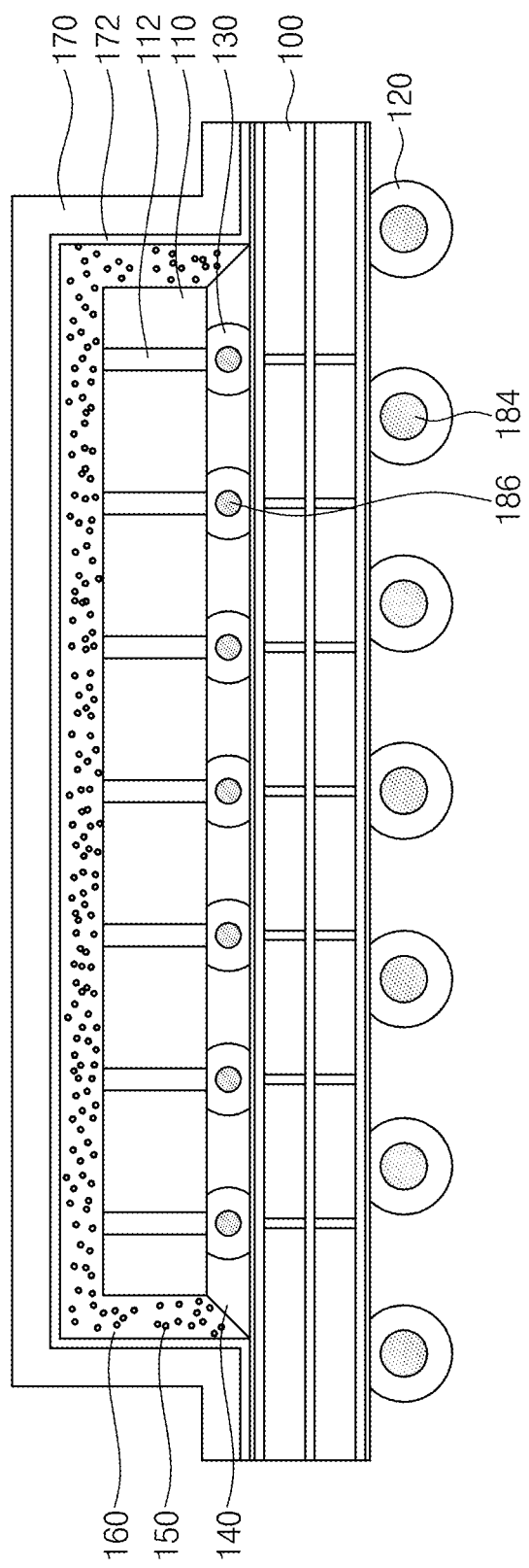

Semiconductor packages according to the present embodiments in FIGS. 5A and 5B may be similar to the semiconductor package in the first embodiments. For the sake of simplicity, the descriptions to the same characteristics and/or the same elements as in the first embodiments will be omitted or mentioned briefly. That is, differences between the present embodiments and the first embodiments will be mainly described hereinafter.

FIGS. 5A and 5B are cross sectional views illustrating semiconductor packages according to yet other embodiments.

Referring to FIGS. 5A and 5B, the semiconductor package may include a circuit substrate 100, a semiconductor chip 110, first solder balls 120 and second solder balls 130, an under filler 140, a molding 160 including one or more first temperature control members 150, and a heat dissipation member 170. Each of the first solder balls 120 may include one or more third temperature control members 184, and each of the second solder balls 130 may include one or more fourth temperature control members 186. The third temperature control member 184 may include the phase change material described in the first embodiment. Also, the fourth temperature control member 186 may include the phase change material described in the first embodiment. The third and fourth temperature control members 184 and 186 may include the same phase change material as the first temperature control member 150. Alternatively, the third and fourth temperature control members 184 and 186 may include phase change materials different from the first temperature control member 150. In an embodiment, the third and fourth temperature control members 184 and 186 may include the first and/or second materials M1 and M2 described with reference to FIGS. 3A and 3B.

As illustrated in FIG. 5A, the third temperature control member 184 may have the same structure as the temperature control member 150 illustrated in FIG. 2A, thereby being scattered within each of the first solder balls 120. The fourth temperature control member 186 may have the same structure as the temperature control member 150 illustrated in FIG. 2A, thereby being scattered within each of the second solder balls 130. Alternatively, as illustrated in FIG. 5B, the third temperature control member 184 may have a sphere shape to be disposed in each of the first solder balls 120. The fourth temperature control member 186 may have a sphere shape to be disposed in each of the second solder balls 130.

In other embodiments, the shape of each of the third and fourth temperature control members 184 and 186 may be one of the shapes of the temperature control members 150 illustrated in FIGS. 2B to 2E.

In some embodiments, the one or more third temperature control members 184 may be agglomerated in a central region of each of the first solder balls 120 and each of the first solder balls 120 may surround a respective one of the one or more third temperature control members 184.

In some embodiments, the one or more fourth temperature control members 186 may be agglomerated in a central region of each of the second solder balls 130, and each of the second solder balls 130 may surround a respective one of the one or more fourth temperature control members 186.

Figure 6A:
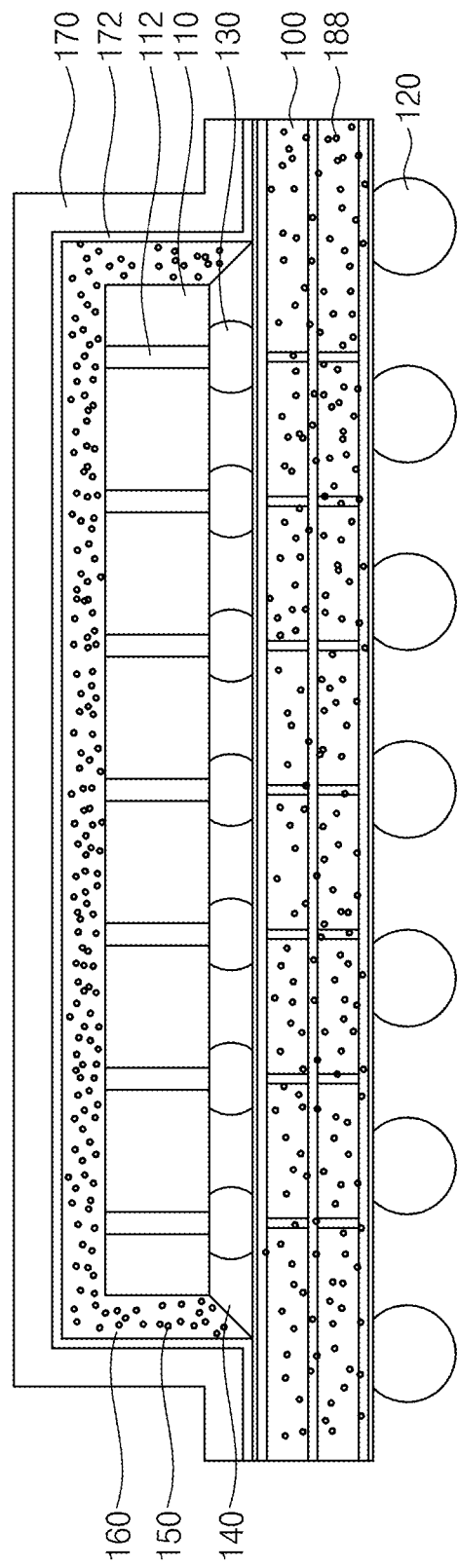
FIGS. 6A through 6C are cross sectional views illustrating semiconductor packages according to yet still other embodiments.
Figure 6B:
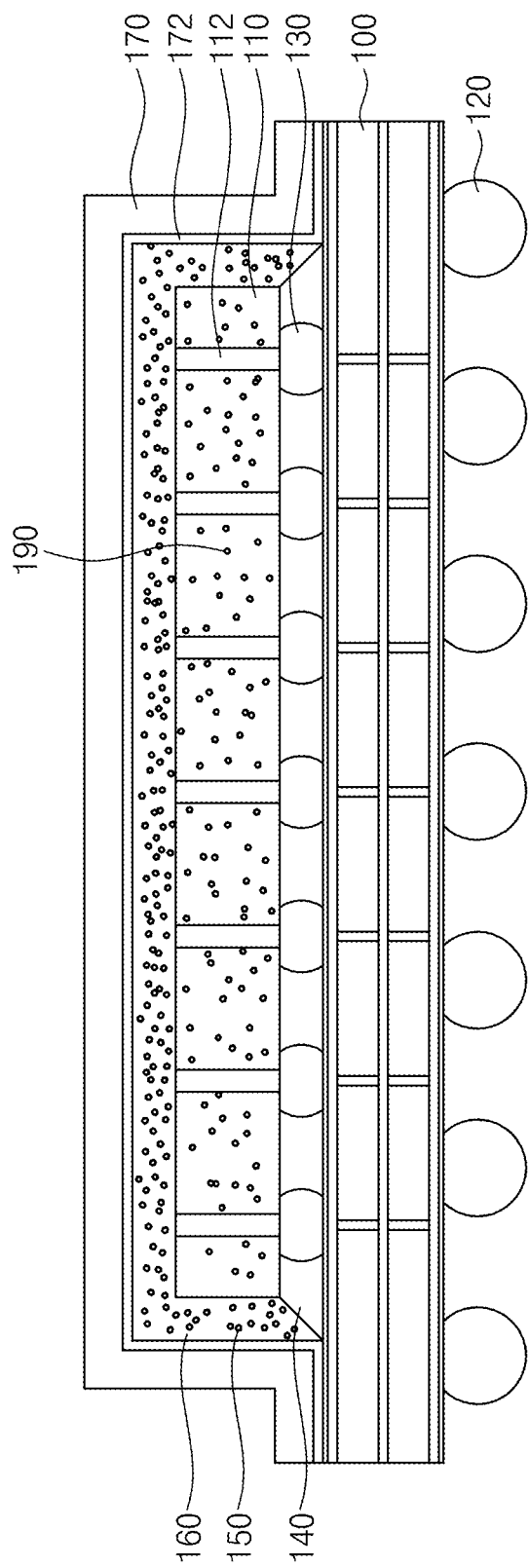
Figure 6C:
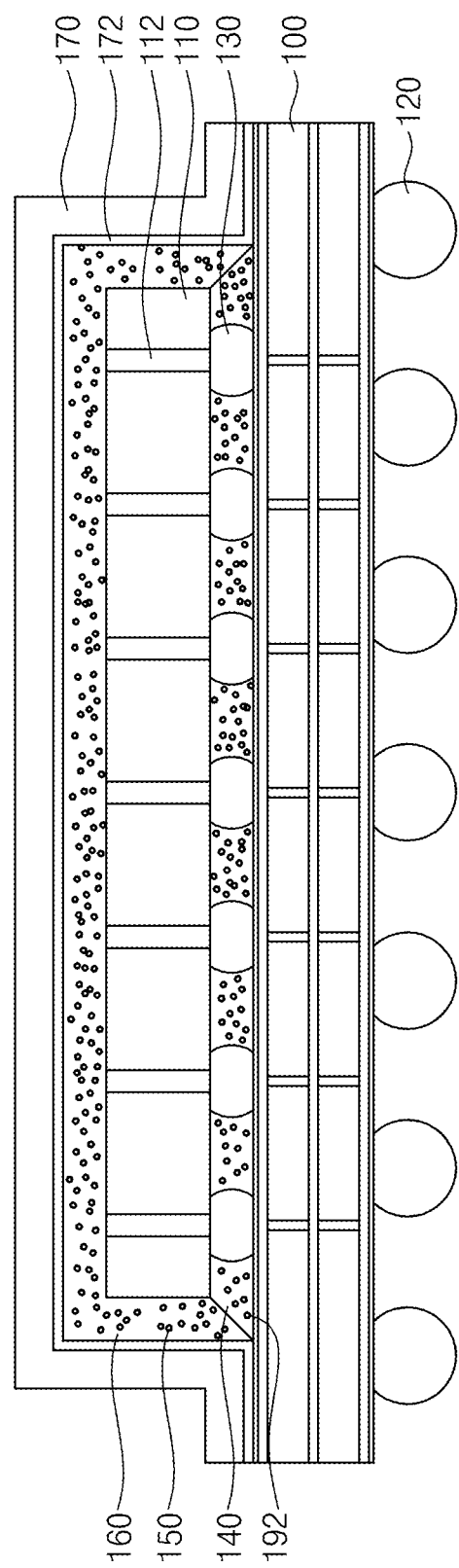

Semiconductor packages according to the embodiments shown in FIGS. 6A to 6C may be similar to the semiconductor package in the first embodiment. For the sake of simplicity, the descriptions to the same characteristics and/or the same elements as in the first embodiment will be omitted or mentioned briefly. That is, differences between the present embodiments and the first embodiments will be mainly described hereinafter.

FIGS. 6A through 6C are cross-sectional views illustrating semiconductor packages according to yet still other embodiments.

Referring to FIGS. 6A through 6C, the semiconductor package may include a circuit substrate 100, a semiconductor chip 110, first solder balls 120 and second solder balls 130, an under filler 140, a molding 160 including one or more first temperature control members 150, and a heat dissipation member 170.

Referring to FIG. 6A, the circuit substrate 100 may include one or more fifth temperature control members 188. The fifth temperature control members 188 may include the phase change material described in the first embodiment. In an embodiment, the fifth temperature control members 188 may include the first and second materials M1 and M2 described with reference to FIGS. 3A and 3B. The fifth temperature control members 188 may have the same structure as the temperature control member 150 illustrated in FIG. 2A, thereby being scattered within the circuit substrate 100.

Referring to FIG. 6B, the semiconductor chip 110 may include one or more sixth temperature control members 190. The sixth temperature control members 190 may include the phase change material described in the first embodiment. In an embodiment, the sixth temperature control members 190 may include the first and second materials M1 and M2 described with reference to FIGS. 3A and 3B.

Referring to FIG. 6C, the under filler 140 may include one or more seventh temperature control members 192. The seventh temperature control members 192 may include the phase change material described in the first embodiment. In an embodiment, the seventh temperature control members 192 may include the first and second materials M1 and M2 described with reference to FIGS. 3A and 3B. The seventh temperature control members 192 may have the same structure as the temperature control member 150 illustrated in FIG. 2A, thereby being scattered within the under filler 140.

In other embodiments, the shapes of the fifth, sixth and seventh temperature control members 188, 190 and 192 may be the same as or similar to one of the shapes of the temperature control members 150 illustrated in FIGS. 2B through 2G.

Components of the semiconductor packages according to the first through fifth embodiments may be combined in various forms under a non-contradictable condition.

[Experiments]

Figure 7:
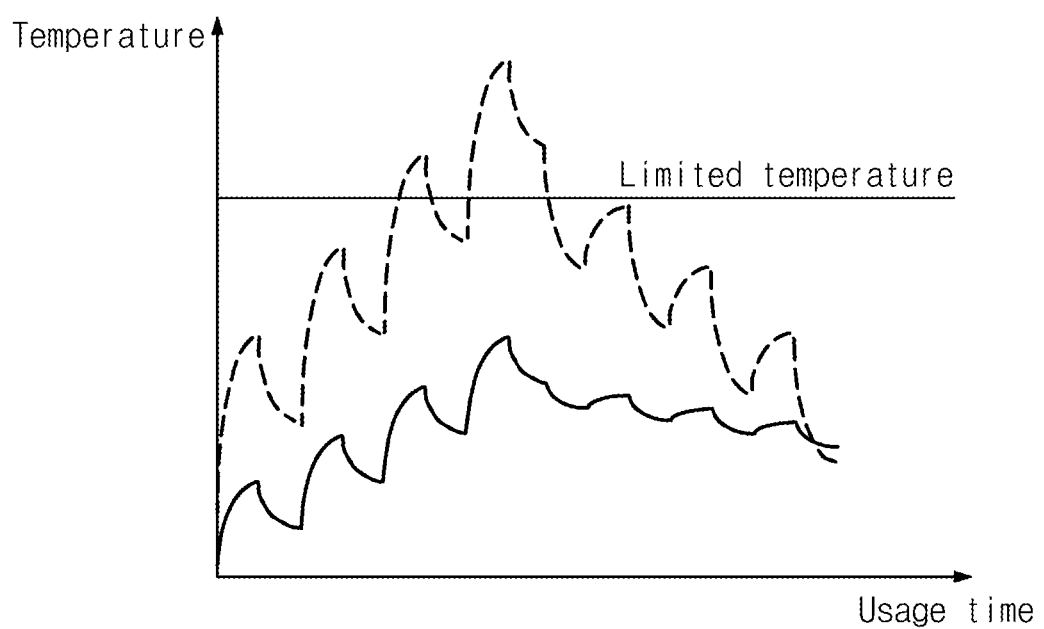
FIG. 7 is a graph illustrating temperature variation with usage time of an electronic product including a semiconductor package according to some embodiments.

FIG. 7 is a graph illustrating temperature variation with usage time of an electronic product including a semiconductor package according to some embodiments. An x-axis in FIG. 7 represents the usage time of the electronic product, and a y-axis in FIG. 7 represents the temperature of the electronic product.

Referring to FIG. 7, a dotted line represents temperature variation with usage time of an electronic product including a conventional semiconductor package. The conventional semiconductor package does not include a temperature control member in its molding.

A full line represents temperature variation with usage time of an electronic product applied with the semiconductor package according to some embodiments. The semiconductor package according to some embodiments (hereinafter, referred as an embodiment semiconductor package) includes the temperature control member disposed in the molding. The embodiment semiconductor package includes the temperature control member 150 illustrated in FIGS. 1 and 2A.

As illustrated in FIG. 7, the temperature of the electronic product applied with the conventional semiconductor package is higher than a limited temperature in some section of the x-axis. In the other hand, the temperature of the electronic product applied with the embodiment semiconductor package is lower than the limited temperature throughout the usage time.

Thermal stability and/or thermal reliability of the semiconductor package including the temperature control member according to some embodiments can be improved than the conventional semiconductor package.

Figure 8A:
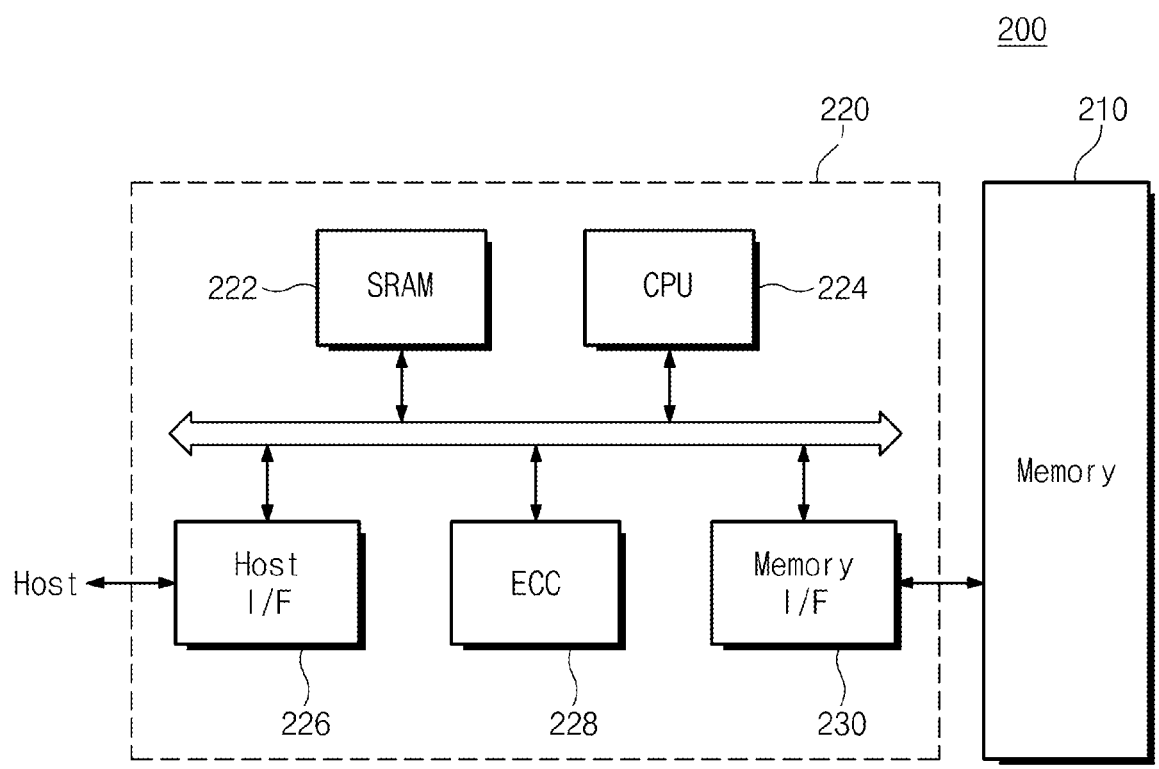
FIG. 8A is a block diagram illustrating a memory card including a semiconductor package according to some embodiments.

FIG. 8A is a block diagram illustrating a memory card including a semiconductor package according to some embodiments.

Referring to FIG. 8A, the semiconductor packages according to some embodiments may be applied to a memory card 200. For example, the memory card 200 may include a memory controller 220 to control a data exchange between a host and a memory 210. A static random access memory (SRAM) 222 may be used as an operation memory of a central processing unit (CPU) 224. A host interface 226 may include data exchange protocol of the host connected to the memory card 200. An error correction code (ECC) 228 may detect and correct at least one error that may be included in data read from the memory 210. A memory interface 230 may interface with the memory 210. The central processing unit 224 performs various control operations for the data exchange of the memory controller 220.

Because the memory 210 in the memory card 200 is formed using the semiconductor package according to some embodiments, heat generated from the memory 210 may be effectively dissipated. As a result, thermal stability of the memory 210 may be improved.

Figure 8B:
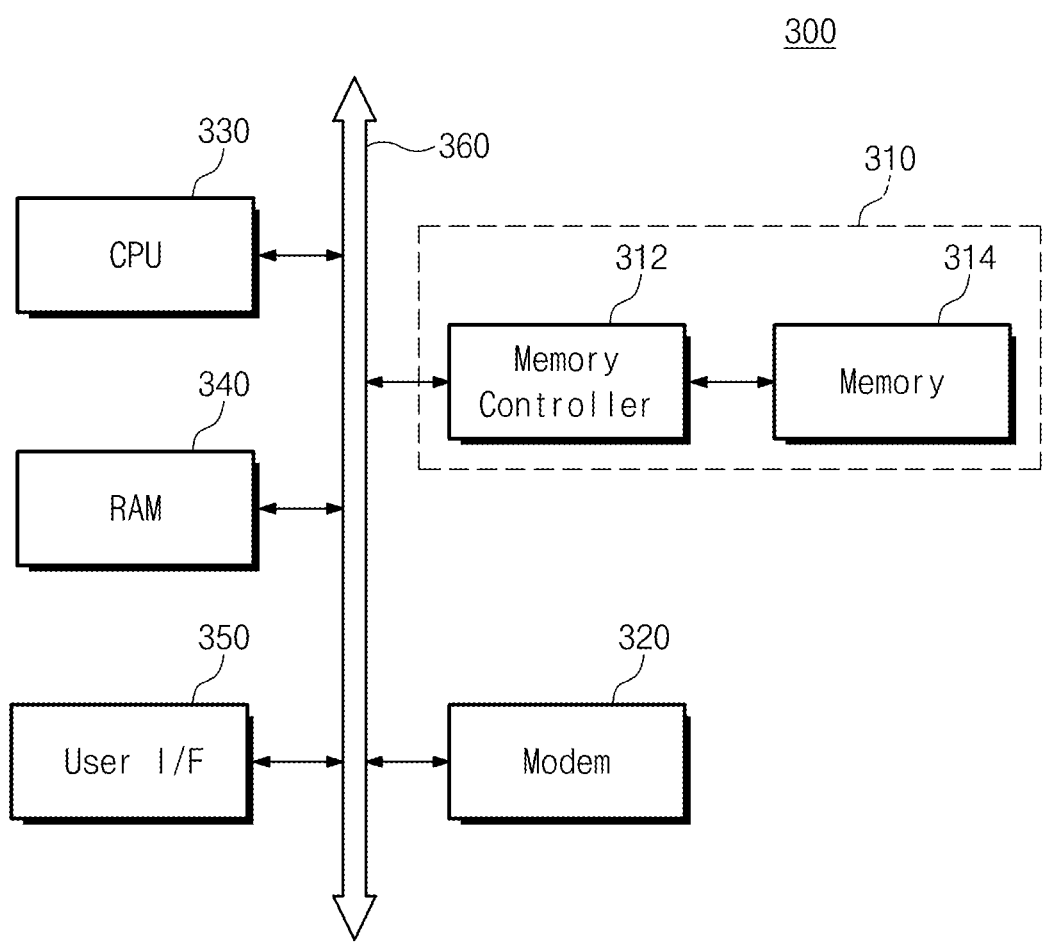
FIG. 8B is a block diagram illustrating an information processing system including a semiconductor package according to some embodiments.

FIG. 8B is a block diagram illustrating an information processing system including a semiconductor package according to some embodiments.

Referring to FIG. 8B, an information processing system 300 may include a memory system 310 including the semiconductor package according to some embodiments. The information processing system 300 may include a mobile device or a computer. For example, the information processing system 300 may include the memory system 310, and a modem 320, a central processing unit 330, a random access memory (RAM) 340 and an user interface 450 that are electrically connected to a system bus 360. The memory system 310 may store data processed by the central processing unit 330 or data received from the outside. The memory system 310 may include a memory controller 312 and a memory 314. The memory system 310 may be constituted to be substantially the same with the memory card 200 described with reference to FIG. 8A. The information processing system 300 may be provided to a memory card, a solid state disk (SSD), a camera image sensor and/or an application chipset. For example, the memory system 310 may be constituted by the solid state disk (SSD). In this case, the information processing system 300 may stably and reliably store mass data in the memory system 310.

Figure 9:
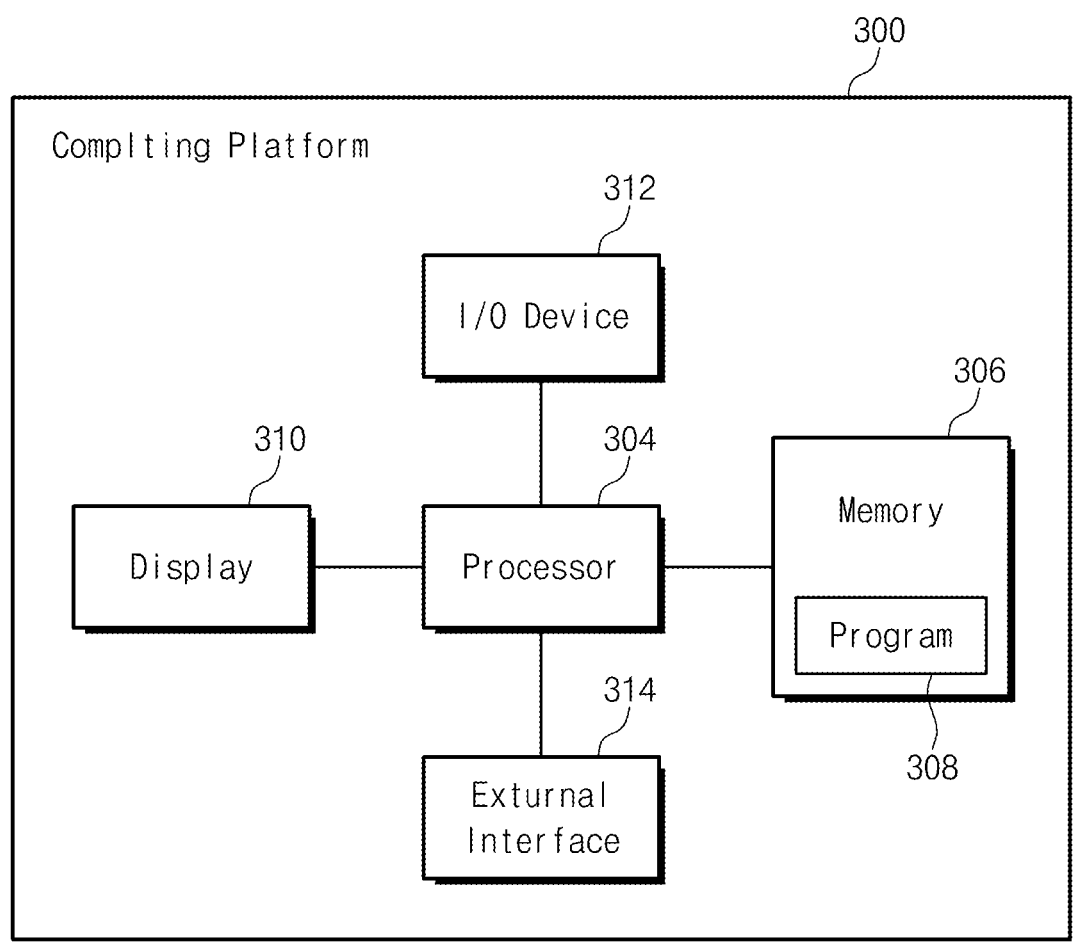
FIG. 9 is a schematic diagram of an example computing platform in accordance with one or more embodiments.

Referring to FIG. 9, a block diagram of a computing platform 300 according to one or more embodiments is illustrated, although the scope of claimed subject matter is not limited in this respect. Computing platform 300 may include the semiconductor package according to some embodiments described in greater detail above.

Computing platform 300 may include more and/or fewer components than those shown in FIG. 9. However, generally conventional components may not be shown, for example, a battery, a bus, and so on.

Computing platform 300, as shown in FIG. 9 may be utilized to embody tangibly a computer program and/or graphical user interface by providing hardware components on which the computer program and/or graphical user interface may be executed. In such a procedure, computer program and/or machine readable instructions may be stored tangibly on a computer and/or machine readable storage medium such as a compact disk (CD), digital versatile disk (DVD), flash memory device, hard disk drive (HDD), and so on. As shown in FIG. 9, computing platform 300 may be controlled by processor 304, including one or more auxiliary processors (not shown). Processor 304 may comprise a central processing unit such as a microprocessor or microcontroller for executing programs, performing data manipulations, and controlling the tasks of computing platform 300. Auxiliary processors may manage input/output, perform floating point mathematical operations, manage digital signals, perform fast execution of signal processing algorithms, operate as a back-end processor and/or a slave-type processor subordinate to processor 304, operate as an additional microprocessor and/or controller for dual and/or multiple processor systems, and/or operate as a coprocessor and/or additional processor. Such auxiliary processors may be discrete processors and/or may be arranged in the same package as processor 304, for example, in a multicore and/or multithreaded processor; however, the scope of the scope of claimed subject matter is not limited in these respects.

Communication with processor 304 may be implemented via a bus (not shown) for transferring information among the components of computing platform 300. A bus may include a data channel for facilitating information transfer between storage and other peripheral components of computing platform 300. A bus further may provide a set of signals utilized for communication with processor 304, including, for example, a data bus, an address bus, and/or a control bus. A bus may comprise any bus architecture according to promulgated standards, for example, industry standard architecture (ISA), extended industry standard architecture (EISA), micro channel architecture (MCA), Video Electronics Standards Association local bus (VLB), peripheral component interconnect (PCI) local bus, PCI express (PCIe), hyper transport (HT), standards promulgated by the Institute of Electrical and Electronics Engineers (IEEE) including IEEE 488 general-purpose interface bus (GPIB), IEEE 696/S-100, and so on, although the scope of claimed subject matter is not limited in this respect.

Other components of computing platform 300 may include, for example, memory 306, including one or more auxiliary memories (not shown). Memory 306 may provide storage of instructions and data for one or more programs 308 to be executed by processor 304. Memory 306 may comprise, for example, semiconductor-based memory such as dynamic random access memory (DRAM) and/or static random access memory (SRAM), and/or the like. Other semi-conductor-based memory types may include, for example, synchronous dynamic random access memory (SDRAM), Rambus dynamic random access memory (RDRAM), ferroelectric random access memory (FRAM), and so on. Alternatively or additionally, memory 306 may comprise, for example, magnetic-based memory, such as a magnetic disc memory, a magnetic tape memory, and/or the like; an optical-based memory, such as a compact disc read write memory, and/or the like; a magneto-optical-based memory, such as a memory formed of ferromagnetic material read by a laser, and/or the like; a phase-change-based memory such as phase change memory (PRAM), and/or the like; a holographic-based memory such as rewritable holographic storage utilizing the photorefractive effect in crystals, and/or the like; and/or a molecular-based memory such as polymer-based memories, and/or the like. Auxiliary memories may be utilized to store instructions and/or data that are to be loaded into memory 306 before execution. Auxiliary memories may include semiconductor based memory such as read-only memory (ROM), programmable read-only memory (PROM), erasable programmable read-only memory (EPROM), electrically erasable read-only memory (EEPROM), and/or flash memory, and/or any block oriented memory similar to EEPROM. Auxiliary memories also may include any type of non-semiconductor-based memories, including, but not limited to, magnetic tape, drum, floppy disk, hard disk, optical, laser disk, compact disc read-only memory (CD-ROM), write once compact disc (CD-R), rewritable compact disc (CD-RW), digital versatile disc read-only memory (DVD-ROM), write once DVD (DVD-R), rewritable digital versatile disc (DVD-RAM), and so on. Other varieties of memory devices are contemplated as well.

Computing platform 300 further may include a display 310. Display 310 may comprise a video display adapter having components, including, for example, video memory, a buffer, and/or a graphics engine. Such video memory may comprise, for example, video random access memory (VRAM), synchronous graphics random access memory (SGRAM), windows random access memory (WRAM), and/or the like. Display 310 may comprise a cathode ray-tube (CRT) type display such as a monitor and/or television, and/or may comprise an alternative type of display technology such as a projection type CRT type display, a liquid-crystal display (LCD) projector type display, an LCD type display, a light-emitting diode (LED) type display, a gas and/or plasma type display, an electroluminescent type display, a vacuum fluorescent type display, a cathodoluminescent and/or field emission type display, a plasma addressed liquid crystal (PALC) type display, a high gain emissive display (HGED) type display, and so forth.

Computing platform 300 further may include one or more I/O devices 312. I/O device 312 may comprise one or more I/O devices 312 such as a keyboard, mouse, trackball, touchpad, joystick, track stick, infrared transducers, printer, modem, RF modem, bar code reader, charge-coupled device (CCD) reader, scanner, compact disc (CD), compact disc read-only memory (CD-ROM), digital versatile disc (DVD), video capture device, TV tuner card, touch screen, stylus, electroacoustic transducer, microphone, speaker, audio amplifier, and/or the like.

Computing platform 300 further may include an external interface 314. External interface 314 may comprise one or more controllers and/or adapters to provide interface functions between multiple I/O devices 312. For example, external interface 314 may comprise a serial port, parallel port, universal serial bus (USB) port, and IEEE 1394 serial bus port, infrared port, network adapter, printer adapter, radio-frequency (RF) communications adapter, universal asynchronous receiver-transmitter (UART) port, and/or the like, to interface between corresponding I/O devices 312. External interface 314 for an embodiment may comprise a network controller capable of providing an interface, directly or indirectly, to a network, such as, for example, the Internet.

According to some embodiments, because the molding may include the temperature control member, heat dissipation efficiency of the semiconductor package can be improved. Also, phase transition of the temperature control member may be various depending on temperature, so that the semiconductor package according to some embodiments may dissipate various thermal energies.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor package comprising:
   a substrate;
   a semiconductor chip mounted on the substrate;
   a molding covering the semiconductor chip and the substrate, and including one or more first temperature control members, wherein the one or more first temperature control members have a particle shape, and the one or more first temperature control members are surrounded by a capsule made of a conductive material; and
   a heat dissipation member covering the molding.

2. The semiconductor package of claim 1, wherein the one or more first temperature control members include a phase change material.

3. The semiconductor package of claim 1, wherein the one or more first temperature control members comprise:
   a first material of which phase transition occurs at a first temperature; and
   a second material of which phase transition occurs at a second temperature different from the first temperature.

4. The semiconductor package of claim 1, wherein the molding further includes a plurality of thermally conductive particles scattered in the one or more first temperature control members.

5. The semiconductor package of claim 1, wherein the one or more first temperature control members have a particle shape, and
   the one or more first temperature control members are scattered in the molding.

6. The semiconductor package of claim 1, the molding further includes a plurality of porous material sections being separated from each other,
   each of the porous material sections has a pore, the one or more first temperature control members each have a particle shape, and
   the one or more first temperature control members are disposed in the pores of the porous material sections.

7. The semiconductor package of claim 1, the molding further includes a porous material having pores,
   the one or more first temperature control members have a particle shape, and
   the one or more first temperature control members are disposed in one of the pores.

8. The semiconductor package of claim 1, wherein the molding includes a plurality of spaces being separated from each other, and each of the spaces is filled with the one or more first temperature control members.

9. The semiconductor package of claim 1, wherein the molding includes a space having a zigzag shape, and the space is filled with the one or more first temperature control members.

10. The semiconductor package of claim 1, further comprising: an adhesive adhering the heat dissipation member to the molding and the substrate, wherein the heat dissipation member includes metal.

11. The semiconductor package of claim 1, further comprising: one or more second temperature control members disposed in the heat dissipation member.

12. A semiconductor package comprising:
    a circuit substrate;
    a semiconductor chip mounted on the circuit substrate;
    a molding covering the semiconductor chip and the circuit substrate, and including one or more first temperature control members;
    a heat dissipation member covering the molding;
    first solder balls electrically interconnecting the circuit substrate and the semiconductor chip;
    an under filler covering the first solder balls and filling a space between the circuit substrate and the semiconductor chip;
    second solder balls disposed on a bottom surface of the circuit substrate;
    one or more second temperature control members disposed in each of the first solder balls; and
    one or more third temperature control members disposed in each of the second solder balls.

13. The semiconductor package of claim 12, wherein the one or more second temperature control members are agglomerated in a central region of each of the first solder balls,
    each of the first solder balls surrounding a respective one of the one or more second temperature control members,
    the one or more third temperature control members are agglomerated in a central region of each of the second solder balls, and
    each of the second solder balls surrounding a respective one of the one or more third temperature control members.

14. The semiconductor package of claim 1, further comprising:
    a heat sink disposed between the semiconductor chip and the molding, and including cooling fins, wherein gap regions between the cooling fins are filled with the molding.

15. A semiconductor package comprising:
    a substrate;
    a semiconductor chip mounted on the substrate; and
    an encapsulant encapsulating the semiconductor chip, the encapsulant including a plurality of temperature control members formed of a phase change material scattered therein, wherein the temperature control members have a particle shape, and the temperature control members are surrounded by a capsule made of a conductive material.

16. The semiconductor package of claim 15, wherein the plurality of temperature control members include at least one of paraffin ($C_{20}$~$C_{45}$), mineral, salt hydrate, carboxylic acid, sugar alcohol, di-n-alkylammonium salt having alkyl groups different from each other, or combinations thereof.

* * * * *